(12) United States Patent
Penton et al.

(10) Patent No.: US 8,190,973 B2
(45) Date of Patent: May 29, 2012

(54) APPARATUS AND METHOD FOR ERROR CORRECTION OF DATA VALUES IN A STORAGE DEVICE

(75) Inventors: Antony John Penton, Cambridge (GB); Andrew Christopher Rose, Cambridge (GB); Paul Stanley Hughes, Sunnyvale, CA (US)

(73) Assignee: ARM Limited, Cambridge (GB)

( * ) Notice: Subject to any disclaimer, the term of this patent is extended or adjusted under 35 U.S.C. 154(b) by 1193 days.

(21) Appl. No.: 12/004,511

(22) Filed: Dec. 21, 2007

(65) Prior Publication Data

US 2009/0164870 A1     Jun. 25, 2009

(51) Int. Cl.
*G06F 11/00*     (2006.01)
(52) U.S. Cl. ......................................................... 714/764
(58) Field of Classification Search .................. 714/763, 714/764, 768
See application file for complete search history.

(56) References Cited

U.S. PATENT DOCUMENTS

| | | | | |
|---|---|---|---|---|
| 5,499,252 A * | 3/1996 | Watanabe | | 714/769 |
| 7,120,836 B1 * | 10/2006 | Englin et al. | | 714/53 |
| 7,152,138 B2 * | 12/2006 | Spencer et al. | | 711/103 |
| 7,203,890 B1 * | 4/2007 | Normoyle | | 714/768 |
| 7,302,619 B1 * | 11/2007 | Tompkins et al. | | 714/54 |
| 7,383,472 B2 * | 6/2008 | Miura | | 714/42 |
| 7,392,457 B2 * | 6/2008 | Tamura et al. | | 714/763 |
| 7,779,333 B2 * | 8/2010 | Taito et al. | | 714/763 |
| 7,913,110 B2 * | 3/2011 | Van Acht et al. | | 714/764 |

OTHER PUBLICATIONS

Bossen et al., "Power4 System Design for High Reliability," (2002), pp. 16-24.
Shirvani et al., "PADded Cache: A New Fault-Tolerance Technique for Cache Memories," 6 pgs.
Lee et al., "Performance of Graceful Degradation for Cache Faults," (2007), 7 pgs.
Fong et al., "Nonvolatile Repair Caches, Repair Embedded SRAM and New Nonvolatile Memories," (2004), 9 pgs.

* cited by examiner

*Primary Examiner* — James C Kerveros
(74) *Attorney, Agent, or Firm* — Nixon & Vanderhye P.C.

(57) ABSTRACT

A data processing apparatus is provided in which a processing unit, by means of a read access request, accesses a storage device which stores data values and error data associated with those data values. When the processing unit accesses a data value in the storage device, error detection circuitry detects if an error is present in that data value and, if necessary, error correction circuitry corrects the read data value. An error cache having at least one entry stores corrected replacement data values, a corrected data value being allocated into an entry of the error cache for every corrected data value that is generated, and the read access request is re-performed. Replacement data values are read from the error cache in preference to data values stored in the storage device. This ensures that the retry mechanism will succeed irrespective of whether the error was a soft error or a hard error. Thus, if any hard errors do occur during normal operation of the storage device, they can effectively be temporarily corrected through use of the error cache to ensure that the retry mechanism proceeds correctly.

15 Claims, 5 Drawing Sheets

APPARATUS AND METHOD FOR ERROR CORRECTION OF DATA VALUES IN A STORAGE DEVICE

BACKGROUND OF THE INVENTION

1. Field of the Invention

The present invention relates to error correction of data values stored in a data storage device.

2. Description of the Prior Art

There are many applications for data processing systems where fault tolerance is an important issue. One such application is in safety critical systems, for example automotive systems that control air bags, braking systems, etc. One particular area of fault tolerance is tolerance to errors that can occur in the data stored within the data processing system. A typical data processing apparatus may include one or more storage devices used to store data values used by the data processing apparatus. As used herein, the term "data value" will be used to refer to both instructions executed by a processing device of the data processing apparatus, and the data created and used during execution of those instructions.

The storage devices within the data processing apparatus are vulnerable to errors. These errors may be soft errors, as for example may be caused by neutron strikes, where the state of data held in the storage device can be changed, but the storage device will still write and read data correctly. Alternatively, the errors may be hard errors, as for example caused by electro-migration, in which the affected memory location(s) within the storage device will always store an incorrect data value, and the error cannot be corrected by re-writing the data value to the storage device location(s). Both soft errors and hard errors can often be corrected using known error correction techniques, so that the correct data value can be provided to the requesting device, for example a processor core. However, for the example of a hard error, if the corrected data value is then written back to the same memory location, it will again be stored incorrectly at that memory location, since the hard error stems from a fault in the storage device itself.

As process geometries shrink, and accordingly the storage devices become smaller and smaller, those storage devices become increasingly vulnerable to errors, and hence it is becoming increasingly important in fault tolerant systems to provide robust techniques for detecting such errors.

Often, hard error faults occur due to manufacturing defects. Accordingly, it is known to perform certain hard error detection techniques at production time in order to seek to identify such hard errors. As an example, the article "Nonvolatile Repair Caches Repair Embedded SRAM and New Nonvolatile Memories" by J Fong et al, Proceedings of the 19$^{th}$ IEEE International Symposium on Defect and Fault Tolerance in VLSI Systems (DFT'04) describes a non-volatile repair cache that can be used to repair random defective memory cells in embedded SRAMs and other memory devices. The repair cache takes the form of a direct mapped cache having multiple entries used to identify predetermined repair addresses. When an access request is issued by a processing unit, the memory address specified by that access request is compared with the predetermined repair addresses identified in the various entries of the repair cache, and in the event of a hit the access proceeds with respect to the data held in a register bank of the repair cache, with the main memory's write or read signal being blocked. In the event of a repair cache miss, then the write or read operations will be executed within the main memory bank. In addition to a direct mapped repair cache, an n way set associative repair cache is also discussed. The repair cache is populated at wafer test stage, i.e. during production. Accordingly, whilst the described technique can be used to redirect accesses to addresses where hard errors are detected at production time, the technique does not assist in handling hard errors that occur after production, for example due to process variation and aging, nor is it of any assistance in handling soft errors.

To assist in the detection and handling of errors occurring post production, it is known to store error correction code (ECC) data or the like (generally referred to as error data herein) which can be stored in association with the data values, for reference when seeking to detect any errors in those stored data values.

One known error correction technique which makes use of such error data applies an error correction operation to data values when they are read out from the storage device, and before the data values are supplied to the requesting device. If an error is detected, the process aims to correct the data value using the associated error data and then supplies the corrected data to the requesting device. However, typically the corrected data is not written back to the storage device itself, nor is any attempt made to determine whether the error was a soft error or a hard error.

Whilst such an "in-line" correction technique can handle both hard and soft errors provided they are correctable (i.e. provided sufficient redundant information is available to be able to calculate what the true data value is), it suffers from a number of disadvantages. Firstly, additional logic is required on the read path, and this can adversely affect the timing of the read operation, and also adversely affects power consumption. Such an approach may also require control logic to stall the device performing the read operation (for example a processor pipeline). Additionally, because the data in the storage device is not corrected, there is a possibility that further errors could occur, and that the accumulating errors may change over time from being correctable to uncorrectable, or even undetectable. To seek to address this issue, some data processing systems provide an error "scrubber" mechanism that is used to periodically test and correct the data stored in the storage device. However, this mechanism requires time, and consumes energy.

As an alternative to such an in-line mechanism as described above, an alternative mechanism that could be attempted would be to detect and correct the data value when it is read, to store the corrected data value back to the memory device, and then to retry the read operation (referred to herein as a "correct and retry" mechanism). In the case of a soft error, this has the effect of correcting the data in the storage device, and hence when the read operation is retried, the correct data is read. However, if the error is a hard error, then the error will re-occur when the read is retried, and the operation will hence enter a loop where the data value is corrected, but continues to be wrong when re-read from the storage device. In this situation there is the potential for the system to "spin-lock", trapped in a loop of accessing, attempting correction and retrying, unless mechanisms are in place to spot such a behavior and break out of the loop.

Three other articles discuss varieties of error correction in the context of caches: "PADded Cache: A New Fault-Tolerance Technique for Cache Memories", by P Shirvani et al, Center for Reliable Computing, Stanford University, 17$^{th}$ (1999) IEEE VLSI Test Symposium; "Performance of Graceful Degradation for Cache Faults" by H Lee et al, IEEE Computer Society Annual Symposium on VLSI (ISVLSI'07); and "Power4 System Design for High Reliability" by D Bossen et al, IBM, pages 16 to 24, IEEE Micro, March-April 2002.

It is desirable to provide an improved manner of handling errors occurring in data values stored in a data storage device.

SUMMARY OF THE INVENTION

Viewed from a first aspect, the present invention provides data processing apparatus comprising: a processing unit for performing data processing operations; a storage device for storing data values and error data associated with said data values; said processing unit accessing said storage device by issuing a read access request specifying an address of a data value in said storage device; access control circuitry, responsive to said read access request, to read said data value specified by the read access request; error detection circuitry for detecting by means of said associated error data an error in said read data value; error correction circuitry for performing error correction on said read data value to generate a corrected data value, if said error detection circuitry indicates occurrence of said error; an error cache having at least one entry, each entry for storing an address identifier and an associated replacement data value; on occurrence of said error, said corrected data value being allocated as the replacement data value in one of said at least one entries of said error cache, and the read access request being reperformed; the access control circuitry being responsive to the access request to cause the data value identified by the address to be read from the error cache in preference to the storage device in the event of a hit being detected in the error cache.

Thus, the present invention provides a data processing apparatus in which a data value stored in a storage device that is discovered to contain errors is replaced by a corrected data value stored in an error cache. This replacement happens dynamically, the error being identified when the processing unit is performing data processing operations, meaning that errors (whether soft or hard) may be dealt with as and when they occur during operation. Indeed, according to the present invention, it is not necessary to establish whether a detected error in a data value is soft or hard before allocating the replacement data value to the error cache, but it is ensured that if an error detected was indeed a hard error, it cannot cause operability problems in the operation of the storage device. Thus, the present invention presents an advantageously simple arrangement.

Furthermore in addition to performing error correction, the processing unit is caused to reissue the read access request. Through use of the error cache mechanism of the present invention, the data value which is the subject of the reissued access request will be found in the error cache, and this hence prevents the possibility of the data processing apparatus becoming "spin-locked" when encountering a hard error in a storage device. Through use of the simple and effective mechanism of the present invention, errors occurring in the storage device can be handled using a "correct-and-retry" style mechanism, whilst being robust to hard errors that may manifest themselves during normal operation, and in particular allowing correct data to be returned even in the presence of such a hard error. Hence, the advantages of a "correct-and-retry" mechanism are retained—such as the fact that error correction mechanism can be provided on a separate path to the normal data retrieval path (providing both power and timing benefits)—whilst the risk of "spin-locking" is addressed.

Whilst there are a number of ways that the error cache can be implemented, in one embodiment the error cache is a write-through cache with respect to said storage device. This has the advantage that if the data in an entry of the error cache must be sacrificed to make room for newer incoming data, there is no need to update the copy of that sacrificed data stored in the storage device.

It will be appreciated that the error cache could take a variety of configurations and forms, but in one embodiment of the present invention the error cache is a single entry cache. Such a small cache, taking up a bare minimum of extra area of expensive on-chip space, is nevertheless generally sufficient to prevent the processing unit from spin-locking, when repeatedly trying to access a particular data value which has suffered a hard error in the storage device. In such an embodiment, at any point in time the error cache only identifies a single specific data value to be replaced. It has been found that in many implementations this still provides an effective mechanism for enabling correct operation of the storage device at any point in time, even in the presence of a hard error. Each time a new error condition is detected, the content of the error cache is overwritten with the newly identified replacement data value, hence ensuring that when the access request is re-performed, the access request will be processed correctly. Whilst the use of the error cache will have been unnecessary if the error was in fact a soft error, by not seeking to distinguish between soft and hard errors, and merely the using the error cache on detection of every error, a small, low power and low cost mechanism can be provided which can effectively handle hard errors manifesting themselves during use, so as to allow correct operation of the storage device in the presence of those hard errors.

Whatever the chosen size of the error cache, it will be appreciated that it is necessarily finite, meaning that it may commonly occur that all entries of the cache contain valid data and there is thus no "empty" space available for a new replacement data value to be stored. Hence, in one embodiment of the present invention, when allocating the corrected data value as the replacement data value in the error cache, if all entries of the error cache contain valid data, one of the at least one entries is selected as a victim entry, the victim entry is invalidated, and the corrected data value is allocated to the victim entry. In such embodiments, it will be appreciated that the error cache is not seeking to establish over time a complete record of all specific data values in the storage device where errors have been detected, nor is it seeking to be used to distinguish between soft errors and hard errors. Instead, the purpose of the error cache is to ensure that at any point in time, correct operation can be ensured even in the presence of a hard error, and hence using automotive terminology may be said to facilitate a "limp home" mode of operation.

Whilst the purpose of the error cache is to store replacement data values for data values stored in the storage device in which errors have been discovered, it will be apparent that it would also be possible for an error to occur in a replacement data value stored in the error cache itself. For this reason in one embodiment of the present invention, the error cache further stores replacement error data and the error detection circuitry detects, by means of the replacement error data, the error in the replacement data value read from the error cache.

On the other hand, it will be appreciated that it would be unlikely for both a data value in the storage device and its replacement data value in the error cache to both contain an error, so in one embodiment of the present invention in the event of said hit being detected in the error cache, the replacement data value is passed directly to the processing unit, bypassing the error detection circuitry. Thus a power and time saving may be made by avoiding the use of the error detection circuitry (and error correction circuitry), where it is unlikely to be required.

In the case that the replacement data value is passed directly to the processing unit, bypassing the error detection circuitry, the error detection circuitry is not employed. However, in one embodiment of the present invention, in the event of the hit being detected in the error cache, the data value stored in the storage device is also read and the error detection circuitry is arranged to detect, by means of the associated error data, whether an error exists in the data value stored in the storage device, and on such detection to produce a hard error detect signal indicating that a hard error has been detected. By this mechanism, because the read access request has already been reperformed for there to be an existing replacement value in the error cache, if an error is found in the data value stored in the storage device, then it is known that that error is a hard error. This information may then be signaled to the processing unit for use as appropriate. As an example, a record of the number of times the hard error detect signal is issued could be kept, and this statistical information could be used to indicate to the user that the data processing apparatus is degrading, for example by triggering an alarm indication when a certain threshold is reached.

The error data stored in association with data values in the storage device may be produced in a variety of ways, at a variety of points in the data processing apparatus, but in one embodiment the data processing apparatus further comprises error data generation circuitry for generating error data to be stored in association with a write data value, when the processing unit issues a write access to write the write data value to a write address in the storage device. In the event that the processing unit tries to write a data value into the storage device, it will be apparent that if that data value has already been replaced by a replacement data value stored in the error cache, then the processing unit should update the value in the error cache, rather than or in addition to the value in the storage device (where an error was found). Thus, in one embodiment, if the write address hits in the error cache, the write data value is written to the error cache, and in one embodiment it also at the same time being written to the storage device.

Those skilled in the art will recognize that the techniques of the present invention are applicable to a wide range of storage devices, but in one embodiment the storage device is a tightly-coupled memory. A tightly coupled memory is typically employed for storing data values for which a rapid and predictable access time is required by a processing unit and hence, by means of the present invention, the reliability of such rapid-access data is enhanced.

Whilst the processing unit, access control circuitry, error detection circuitry, error correction circuitry and error cache could be single units, in one embodiment of the present invention the processing unit, access control circuitry, error detection circuitry, error correction circuitry and error cache are processing circuitry; the data processing apparatus further comprising duplicate processing circuitry for duplicating operations of the processing circuitry; and comparison circuitry for detecting errors occurring in operations of the processing circuitry by comparison with operations of the duplicate processing circuitry. Whilst this is a relatively expensive solution due to the requirement to provide the duplicate processing circuitry, it will provide significant improved robustness to errors in safety critical applications, for example such as air-bag systems, braking systems and so on in the automotive industry. Hence, as an example, if an error did occur in the error cache, then by comparing the outputs from the processing circuitry and the duplicate processing circuitry, the presence of that error would be detected. This can be used to initiate any one of a number of known recovery mechanisms.

Whilst it will be understood that the reperformance of the read access request could be caused to occur in a variety of ways, in one embodiment of the present invention the error detection circuitry causes the read access request to be reperformed by issuing a branch to self control signal to the processing unit to cause the processing unit to re-execute an instruction that caused the access request to be issued. The use of a branch to self mechanism provides a particularly simple and effective mechanism for causing re-execution of the instruction that issued the access request.

Viewed from a second aspect, the present invention provides a method of handling errors in data values stored in a storage device accessed by a processing unit when performing data processing operations, said method comprising the steps of: storing in a storage device data values and error data associated with said data values; accessing said storage device by issuing a read access request specifying an address of a data value in said storage device; reading said data value specified by the read access request; detecting by means of said associated error data an error in said data value; performing error correction on said read data value to generate a corrected data value, if said error is detected in said detecting step; in an error cache having at least one entry, storing an address identifier and an associated replacement data value, said replacement data value being allocated in said error cache; reperforming said read access request; and in response to the read access request causing the data value identified by the address to be read from the error cache in preference to the storage device in the event of a hit being detected in the error cache.

Viewed from a third aspect, the present invention provides a data processing apparatus comprising: processing means for performing data processing operations; storage means for storing data values and error data associated with said data values; said processing means accessing said storage means by issuing a read access request specifying an address of a data value in said storage means; access control means, responsive to said read access request, to read said data value specified by the read access request; error detection means for detecting by means of said associated error data an error in said read data value; error correction means for performing error correction on said read data value to generate a corrected data value, if said error detection means indicates occurrence of said error; an error cache means having at least one entry, each entry for storing an address identifier and an associated replacement data value; on occurrence of said error, said corrected data value being allocated as the replacement data value in one of said at least one entries of said error cache means, and the read access request being reperformed; the access control means being responsive to the access request to cause the data value identified by the address to be read from the error cache means in preference to the storage means in the event of a hit being detected in the error cache means.

Viewed from a fourth aspect, the present invention provides data processing circuitry for accessing a storage device storing data values and error data associated with said data values, the data processing circuitry comprising: a processing unit for performing data processing operations; said processing unit accessing said storage device by issuing a read access request specifying an address of a data value in said storage device; access control circuitry, responsive to said read access request, to read said data value specified by the read access request; error detection circuitry for detecting by means of said associated error data an error in said read data value; error correction circuitry for performing error correction on said read data value to generate a corrected data value, if said error detection circuitry indicates occurrence of said error; an error cache having at least one entry, each entry for storing an address identifier and an associated replacement data value; on occurrence of said error, said corrected data value being allocated as the replacement data value in one of said at least one entries of said error cache, and the read access request being reperformed; the access control circuitry being responsive to the access request to cause the data value identified by the address to be read from the error cache in preference to the storage device in the event of a hit being detected in the error cache.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
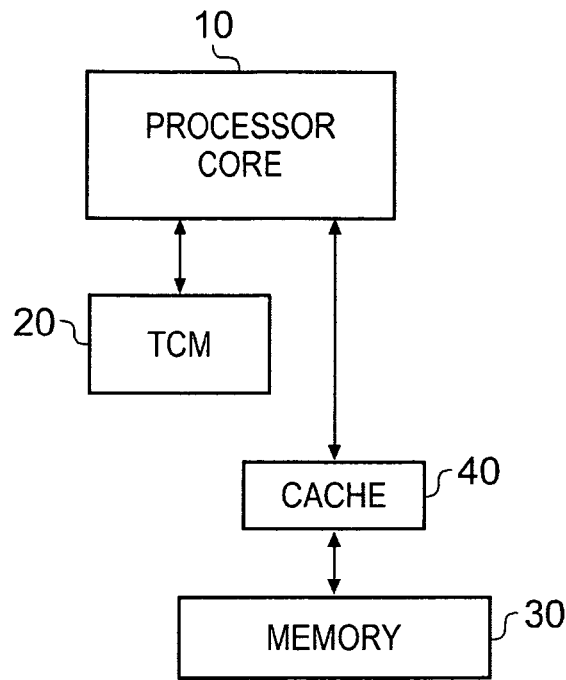
FIG. 1 is a schematic diagram illustrating a data processing system including a data processing apparatus according to the present invention.

FIG. 1 schematically illustrates a data processing apparatus according to one embodiment of the present invention. A processor core 10 is operable to retrieve data values it requires for data processing operations from either a tightly coupled memory (TCM) 20 or from an external memory 30. In this description the processor core is also variously referred to as a "processor" or a "processing unit". In alternative embodiments the processing unit may be a digital signal processor (DSP), a hardware accelerator, Direct Memory Access (DMA) circuitry, etc. A cache 40 is situated on the path between the processor core 10 and the memory 30 to provide rapid access to data values commonly or repeatedly accessed in memory 30. In the embodiment illustrated processor core 10, TCM 20 and cache 40 are provided on-chip, whilst memory 30 is typically an off-chip device, though it may also be provided on-chip.

Figure 2:
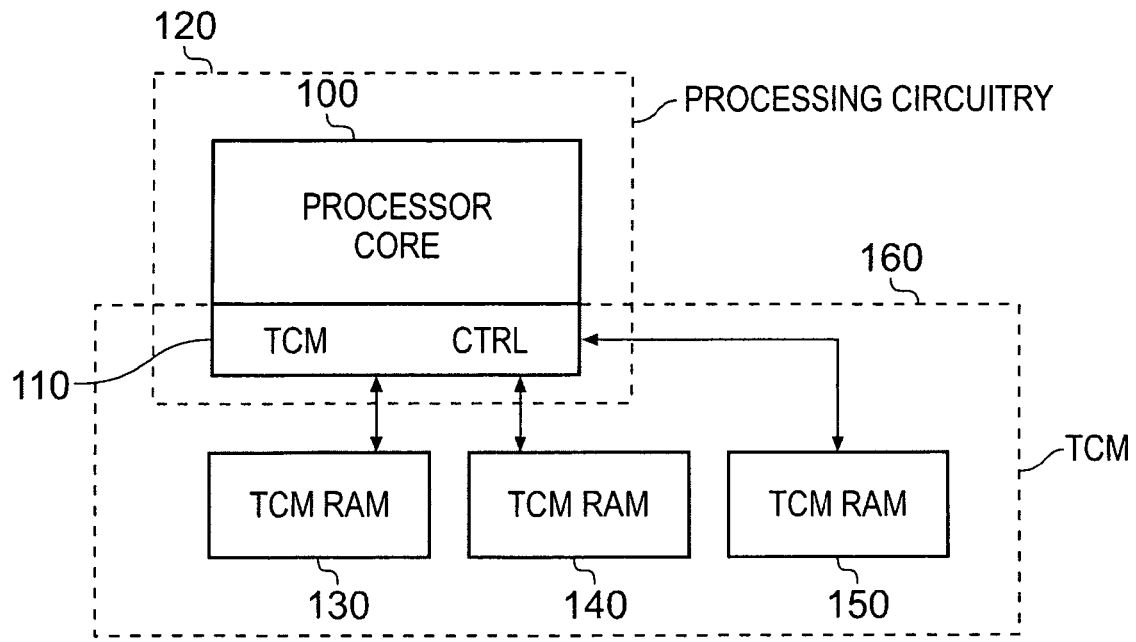
FIG. 2 is a schematic diagram illustrating processing circuitry and tightly coupled memory.

FIG. 2 schematically illustrates an embodiment of the present invention in which a processor core interacts with a TCM. In this embodiment the TCM is composed of three TCM RAMs, although it will be appreciated by those skilled in the art that the invention is equally applicable to single memory devices. The interface between processor core 100 and the TCM storage devices, i.e. TCM RAMs 130, 140 and 150, is provided by the TCM control (CTRL) circuitry 110. As illustrated, it can be seen that processor core 100 and TCM control circuitry 110 may be considered to form a block of processing circuitry 120. On the other hand, TCM control circuitry 110 taken together with the TCM RAMs 130, 140 and 150 may be considered to form the TCM 160. When processor core 100 wishes to access a data value stored in TCM 160 it issues an access request which is handled by TCM control circuitry 110. Firstly, TCM control circuitry 110 determines which of the TCM RAMs contains the required data value and issues the appropriate control signals to retrieve the data value from that RAM. Secondly, TCM control circuitry 110 contains error detection and correction logic (often generically referred to as ECC logic) for detecting and correcting errors in data values read from the TCM RAMs. When an error is discovered by the ECC logic in a data value read from the TCM RAMs, the TCM control circuitry 110 is arranged to write a corrected version of the data value to an error cache which forms part of TCM control circuitry 110 as well as to the corresponding TCM RAM. Then, when a subsequent access to the same data value is made by the processor core 100, the TCM control circuitry 110 is operable to retrieve the replacement data value from the error cache rather than from the TCM RAMs. Furthermore, part of the ECC logic is arranged to signal to the processor core 100 to retry an access request for a data value when an error in that data value is identified. In the meantime, in parallel to signaling to the processor core to retry the access request, the ECC logic corrects the data value, writing the corrected replacement data value into the error cache, such that the retried access request may retrieve the corrected data value from the error cache. This functionality will be further described with reference to the following figures.

Figure 3:
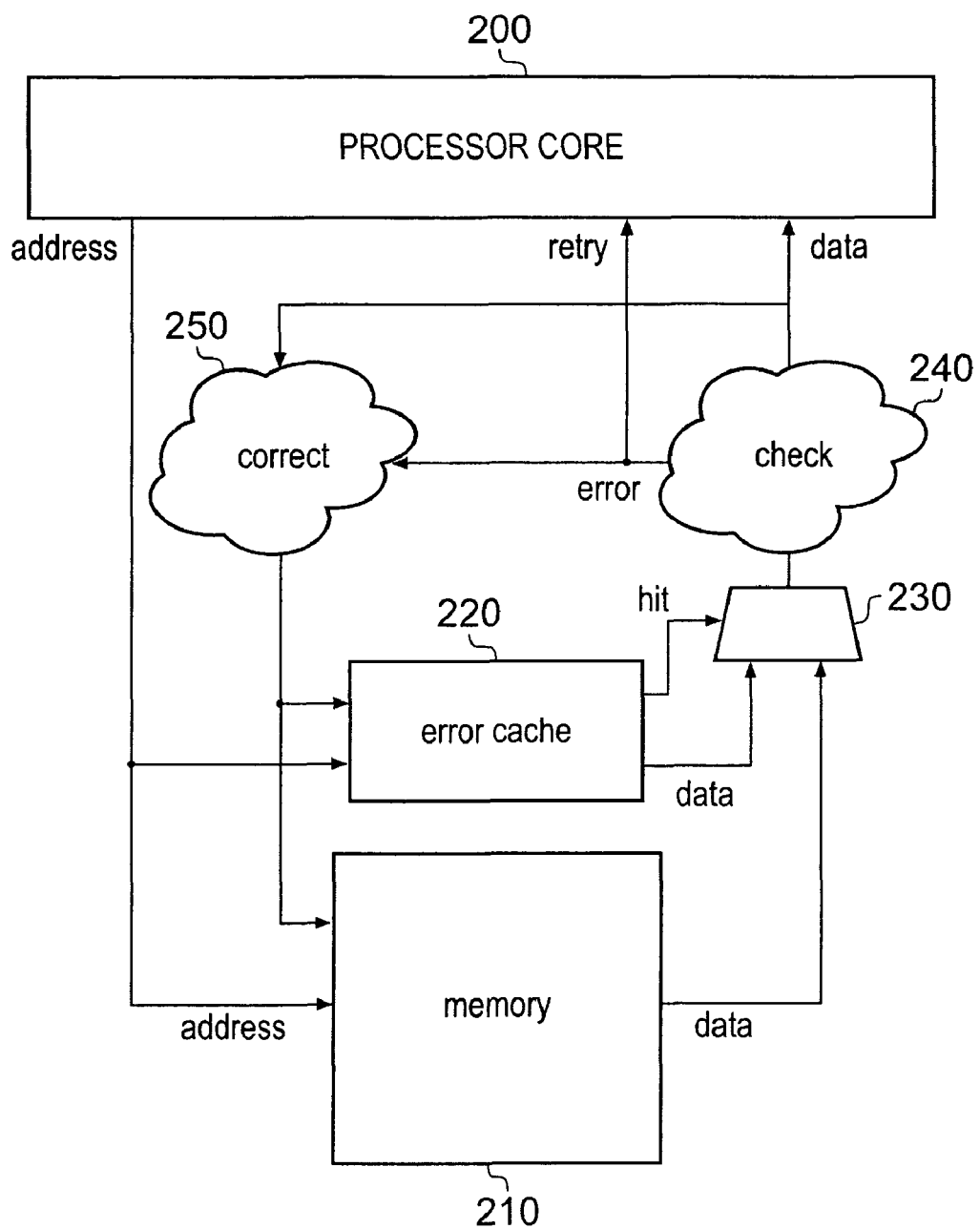
FIG. 3 is a schematic diagram illustrating a data processing apparatus according to one embodiment of the present invention.

FIG. 3 schematically illustrates a data processing apparatus according to one embodiment of the present invention. When the processor core 200 wishes to access a data value stored in memory 210 (e.g. the TCM 160), it issues a read access request specifying an address of a data value in the memory 210. This address is passed to both the memory 210 and the error cache 220 (to check for a hit in the error cache, i.e. whether the data value stored at that address is currently cached in error cache 220). Multiplexer 230 receives any data read out from error cache 220 following a hit therein, as well as the data read out from the memory 210, and is configured to preferentially pass data read out from error cache 220.

In addition to the data values themselves, the memory 210 also stores error data in association with each stored data value, which enable errors in the stored data value to be identified and corrected. The skilled person will be familiar with various ways of doing this (parity bits, redundant information etc.) and the detail of this error correction is not discussed further herein. Optionally, error data may also be stored in association with the replacement data values stored in the error cache, although these data may be omitted if it is considered sufficiently unlikely that an error will occur in the replacement data values.

The read out data is passed from multiplexer 230 to error detection circuitry 240, which makes use of the error data stored in association with a given data value to check whether an error is present in that data value. If no error is found, then the data value is passed to processor core 200 to continue its data processing operations making use of that data value. If however an error is found, then error detection circuitry 240 signals that an error has occurred. This signal is passed both to the processor core as a "retry" signal, indicating that the processor core should re-issue the read access request for the data value, and is also passed to error correction circuitry 250 to initiate an error correction process.

The re-issuance of the read access request can be performed in a various ways, for example by re-executing the instruction that resulted in the read access request (e.g. by sending a "branch-to-self" signal to the processor core). Whilst an instruction might result in just a single read access request, the instruction could also be a multiple load instruction (i.e. one instruction resulting in many read access requests). In this latter case, the error cache may be required to have more than one entry, since despite the provision of the error cache, it would still be possible for the apparatus to "spin-lock". This is because if more than one hard error were to be encountered by a multiple load instruction, then the error cache would thrash between allocations of replacement values for each of those hard errors, continually re-requesting the re-issuance of the multiple load instruction. In practice, if multiple load instructions are to be reissued, it may be preferred for the error cache to have several entries since more than one load could encounter a hard error. Alternatively, it would be possible for just the particular read access request to be repeated in which the error was encountered.

Error correction circuitry 250 also receives the data output from error detection circuitry 240, which in this instance is known to contain an error, and performs error correction on that value to generate a corrected data value. This corrected data value is then passed both to error cache 220 and to memory 210. The replacement data value being written to memory 210 will correct the error in that data value if the error was soft, however if the error was hard then even rewriting the data value in this manner will not correct the error. The replacement data value is allocated into one entry of error cache 220 irrespective of whether the error was hard or soft. If all entries of the error cache are presently valid, an entry is selected (e.g. the least recently used) for invalidation and allocation. Thus, when the processor core re-issues the read access request the address will hit in the error cache and the replacement data value will be output therefrom. On this iteration of the read access request the address hits in the error cache and therefore the replacement data value stored in the error cache 220 is (by means of multiplexer 230) taken in preference to the value that will also be retrieved from memory 210. No error should be detected in this value by error detection circuitry 240 and it may be chosen to pass the value straight to processor core 200, although a further safety net may be implemented by also storing error data with the replacement data value in the error cache 220 and error checking the replacement data value as well.

Thus, it will be appreciated that the provision of the error cache 220 in embodiments of the present invention saves such a "correct and retry" mechanism from potentially "spin-locking" when encountering a hard error in memory. This is because despite provision of the error correction circuitry, a replacement (corrected) data value rewritten to the memory 210 is not able to correct the error in the data value stored there (indeed, this is the definition of a "hard" error). Without the provision of the error cache 220 to provide a replacement data value the system would become trapped in a spin-lock since the processor core would continually re-issue its read access request for a data value containing a hard error in memory 210.

Figure 4:
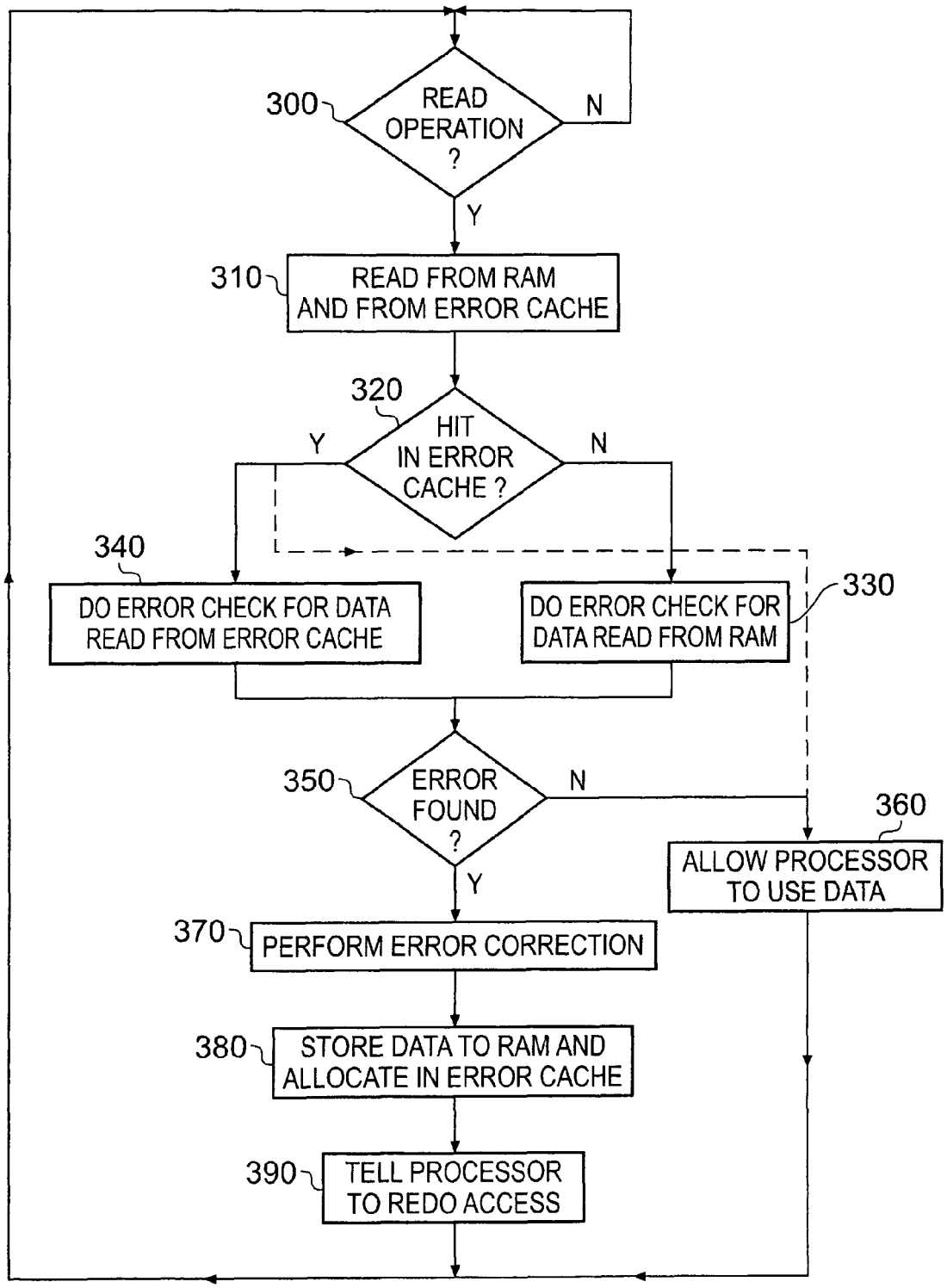
FIG. 4 is a flow diagram illustrating a series of steps carried out by a data processing apparatus according to one embodiment of the present invention.

A series of steps carried out by a data processing apparatus such as that illustrated in FIG. 3 is schematically illustrated in FIG. 4. At step 300 a read operation (i.e. the issuance of a read access request) is waited for. When a read access request is issued, at step 310 data corresponding to the specified address are read from the memory (RAM) and (so long as a hit occurs there) from the error cache. For the purposes of the discussion of this figure it is assumed that only read access requests for valid addresses within the RAM are issued. At step 320 it is established whether indeed there was a hit in the error cache. If not, then at step 330 the error detection circuitry performs an error check for the data read from the RAM. Conversely, if there was a hit in the error cache then at step 340 the error detection circuitry performs an error check for the data read from the error cache. Proceeding via either steps 330 or 340, the flow continues to step 350 where it is checked whether an error has been found in the read data value. If not, then the flow proceeds to step 360 where the processor is allowed to use the data that has been read out and the flow returns to step 300 where a new read operation is waited for. At this point it is instructive to note the optional path connecting step 320 to step 360, which allows the error detection steps to be omitted for data retrieved from the error cache, since in some embodiments it may be preferable (for speed/power reasons) to assume that replacement data values retrieved from the error cache will not themselves contain errors.

If however at step 350 it is established that an error is present in the data value read out then the flow proceeds to step 370 where the error correction circuitry performs an error correction operation on the data value. The corrected data value is then stored in the RAM and allocated into an entry of the error cache (step 380). Also, at step 390 a signal is issued to the processor core to tell the processor to re-do this access request and the flow returns to step 300, the next iteration of this access request proceeding as described above. Since the corrected data value has just been stored in the error cache as a replacement data value, on this iteration the address should hit in the error cache at step 320 and the processor can be allowed (step 360) to use this replacement data value (on the assumption that no error will have occurred in the value stored in the error cache).

Figure 5:
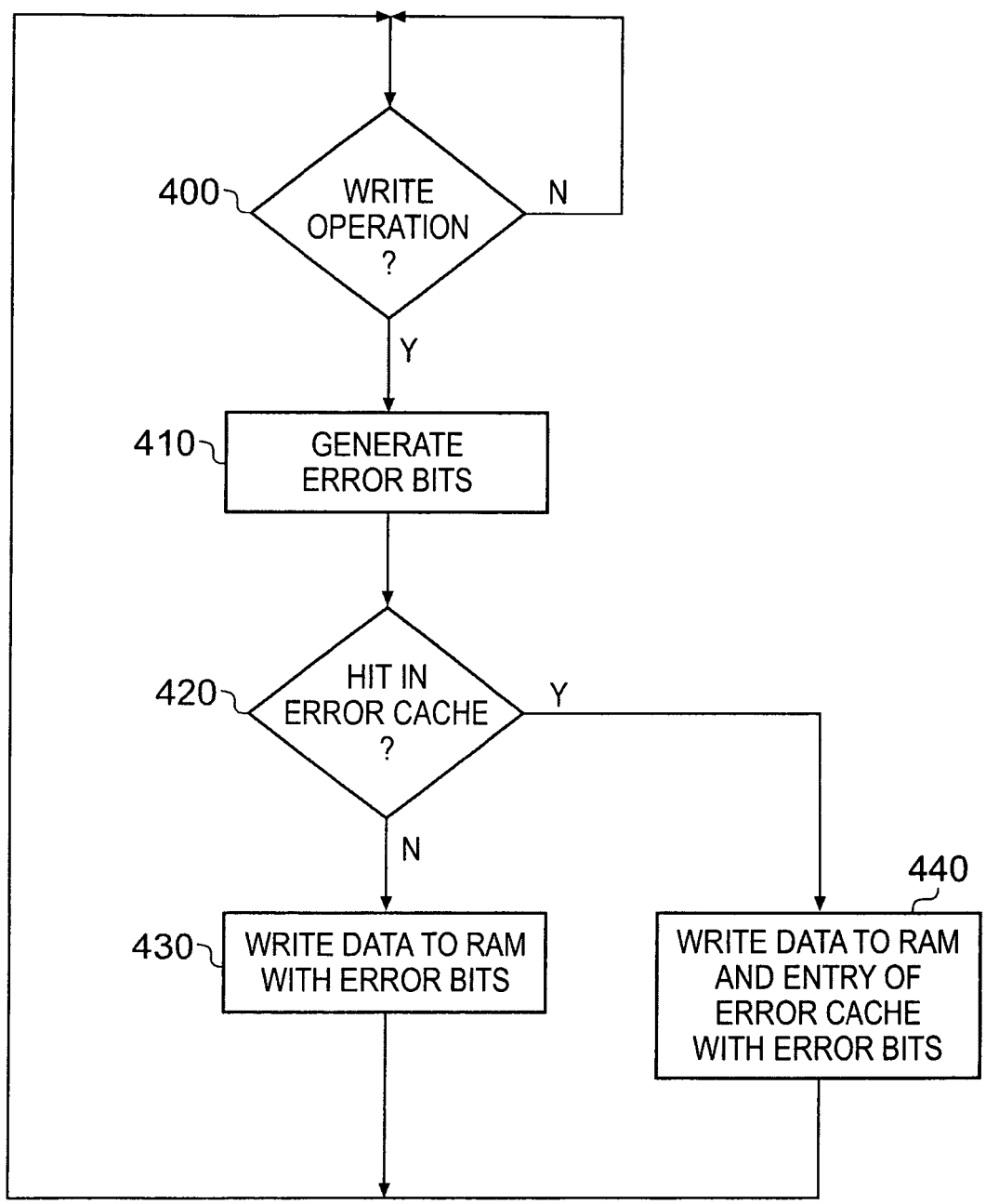
FIG. 5 is a flow diagram illustrating a further series of steps carried out by a data processing apparatus according to one embodiment of the present invention.

The above discussion of FIGS. 1 to 4 has concentrated on read operations of the data processing apparatus. FIG. 5 schematically illustrates a set of steps carried out by the data processing apparatus in one embodiment of the present invention when carrying out a write operation. At step 400 a write operation (i.e. the issuance of a write access request from the processor) is waited for. Once a write access request is issued by the processor then at step 410 error bits (i.e. error data) are generated to be stored in association with the data value which is the subject of the write access request. This generation may, for example, be carried out by the access control circuitry (e.g. TCM CTRL 110 in FIG. 2) of the memory or by the processor itself. Then at step 420 it is checked whether the address specified in the write access request hits in the error cache. If it does not, then at step 430 the data is written to the RAM with the associated error bits generated at step 410. If however the address does hit in the error cache at step 420, then at step 440 the data is written to both the RAM and to the entry of the error cache, along with the associated error bits generated at step 410. In this way, replacement data values written to the error cache may be updated by the processor core if, for example, the processor core carries out data processing operations resulting in a change of a data value stored in the error cache. Finally, the flow returns to step 400 and waits for a new write operation.

Figure 6:
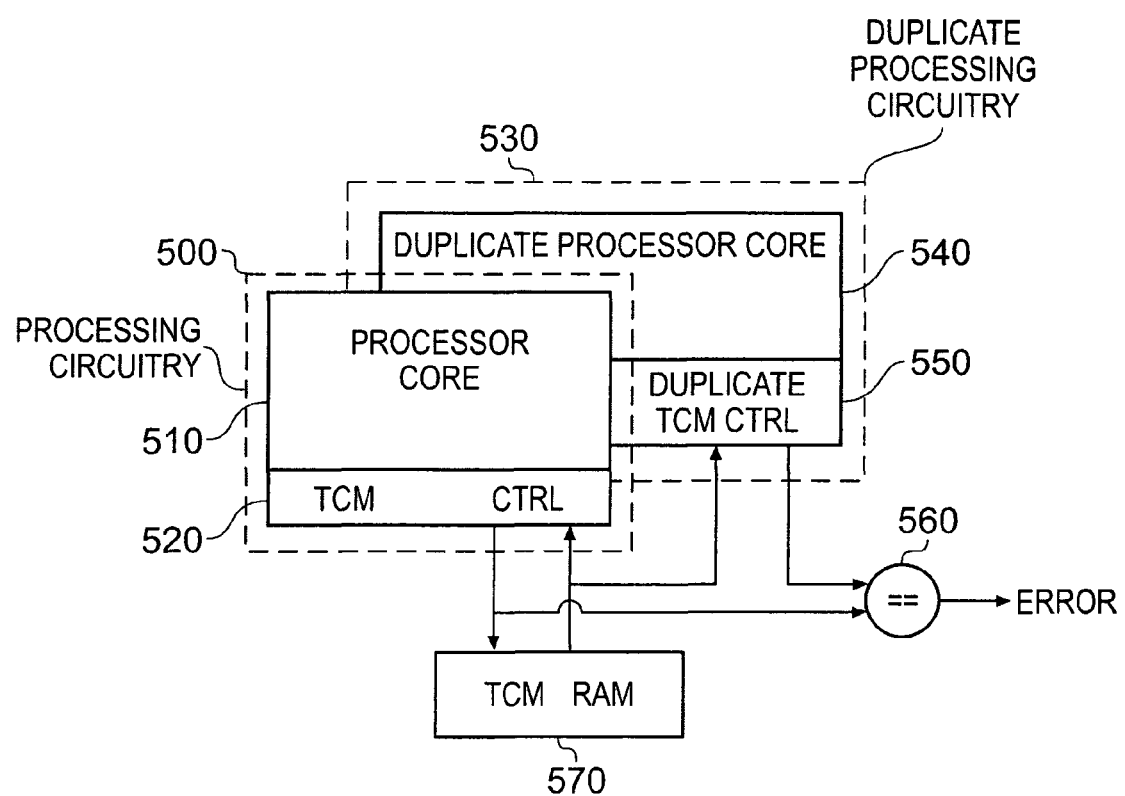
FIG. 6 is a schematic diagram illustrating a data processing system including a processing circuitry and duplicate processing circuitry according to one embodiment of the present invention.

It will be appreciated that storing error data in association with data values stored in a storage device such as a TCM RAM is a way of ensuring the reliability of data values read from that storage device by means of redundant information. FIG. 6 illustrates an embodiment of the present invention in which the principle of redundancy is extended to the processing circuitry. Processing circuitry 500 comprises processor core 510 and TCM control circuitry 520. This processing circuitry is duplicated by duplicate processing circuitry 530 which comprises duplicate processor core 540 and duplicate TCM control circuitry 550. The reliability of processing circuitry 500 is checked by comparator circuitry 560 which compares signals output from processing circuitry 500 and from duplicate processing circuitry 530. If these do not match then comparator 560 signals an error. Only the signals from processing circuitry 500 are actually passed to TCM RAM 570, but the signals returning from TCM RAM 570 to processing circuitry 500 are also passed to duplicate processing circuitry 530 to enable it to exactly copy (so long as no errors occur) the operations of processing circuitry 500. In the event of any discrepancy between the output from the processing circuitry 500 and the duplicate processing circuitry 530, an error signal is generated and this can be used to initiate any required recovery operation. Hence, by way of example, in an embodiment in which no error data is stored in association with the replacement data values in the error cache, if an error did occur in the contents of the error cache, this would nevertheless be indicated by the difference in output between the processing circuitry 500 and the duplicate processing circuitry 530, and accordingly an error would be generated.

Hence the present invention provides a data processing apparatus in which a processing unit, by means of a read access request, accesses a storage device which stores data values and error data associated with those data values. When the processing unit accesses a data value in the storage device, error detection circuitry detects if an error is present in that data value and, if necessary, error correction circuitry corrects the read data value. An error cache having at least one entry stores corrected replacement data values, a corrected data value being allocated into an entry of the error cache for every corrected data value that is generated, and the read access request is re-performed. Replacement data values are read from the error cache in preference to data values stored in the storage device. No attempt is made to distinguish between soft and hard errors, and instead whenever an error occurs, a correct and retry mechanism is instigated, and additionally one of the entries in the error cache is allocated to store corrected replacement data value. This ensures that the retry mechanism will succeed irrespective of whether the error was a soft error or a hard error. Whilst if the error was a soft error, there would be an expectation that the retry mechanism would operate correctly anyway, it has been found that it is much simpler and more efficient to merely use the error cache mechanism for any error rather than seeking to detect whether the error is in fact a hard error or a soft error. Through use of such a mechanism, if any hard errors do occur during normal operation of the storage device, they can effectively be temporarily corrected through use of the error cache to ensure that the retry mechanism proceeds correctly.

It should be noted that no permanent record of the hard errors is seeking to be retained, and instead the small simple mechanism used in embodiments of the present invention is merely intended to ensure that the retry following the detection of the error is successful. In due course, contents in the error cache will be overwritten by replacement data values for new data values where errors are detected, and the error cache only needs store temporary information that is useful in ensuring correct operation of the retry operation occurring following detection of a current error.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A data processing apparatus comprising:
   a processing unit for performing data processing operations;
   a storage device configured to store data values and error data associated with said data values;
   said processing unit accessing said storage device by issuing a read access request specifying an address of a data value in said storage device;
   access control circuitry, responsive to said read access request, configured to read said data value specified by the read access request;
   error detection circuitry for detecting by means of said associated error data an error in said read data value;
   error correction circuitry for performing error correction on said read data value to generate a corrected data value, if said error detection circuitry indicates occurrence of said error;
   an error cache having at least one entry, each entry configured to store an address identifier and an associated replacement data value;
   on occurrence of said error, said error cache configured to allocate said corrected data value as the replacement data value in one of said at least one entries of said error cache, and the read access request being performed again;
   the access control circuitry, responsive to the access request, and configured to cause the data value identified by the address to be read from the error cache in preference to the storage device in the event of a hit being detected in the error cache.

2. A data processing apparatus as claimed in claim 1, wherein said error cache is a write-through cache with respect to said storage device.

3. A data processing apparatus as claimed in claim 1, wherein said error cache is a single entry cache.

4. A data processing apparatus as claimed in claim 1, wherein when allocating said corrected data value as the replacement data value in said error cache, if all entries of said error cache contain valid data, one of said at least one entries is selected as a victim entry, said victim entry is invalidated, and said corrected data value is allocated to the victim entry.

5. A data processing apparatus as claimed in claim 1, wherein said error cache further stores replacement error data and said error detection circuitry detects, by means of said replacement error data, said error in said replacement data value read from said error cache.

6. A data processing apparatus as claimed in claim 1, wherein in the event of said hit being detected in the error cache, said replacement data value is passed directly to said processing unit, bypassing said error detection circuitry.

7. A data processing apparatus as claimed in claim 6, wherein in the event of said hit being detected in the error cache, said data value stored in said storage device is also read and said error detection circuitry is arranged to detect, by means of said associated error data, whether an error exists in said data value stored in said storage device, and on such detection to produce a hard error detect signal indicating that a hard error has been detected.

8. A data processing apparatus as claimed in claim 1, further comprising error data generation circuitry for generating error data to be stored in association with a write data value, when said processing unit issues a write access to write said write data value to a write address in said storage device.

9. A data processing apparatus as claimed in claim 8, wherein if said write address hits in said error cache, said write data value is written to said error cache.

10. A data processing apparatus as claimed in claim 1, wherein said storage device is a tightly-coupled memory.

11. A data processing apparatus as claimed in claim 1, wherein said processing unit, access control circuitry, error detection circuitry, error correction circuitry and error cache are processing circuitry;

said data processing apparatus further comprising duplicate processing circuitry for duplicating operations of said processing circuitry; and comparison circuitry for detecting errors occurring in operations of said processing circuitry by comparison with operations of said duplicate processing circuitry.

12. A data processing apparatus as claimed in claim 1, wherein the error detection circuitry causes the read access request to be re-performed by issuing a branch to self control signal to the processing unit to cause the processing unit to re-execute an instruction that caused the access request to be issued.

13. A method of handling errors in data values stored in a storage device accessed by a processing unit when performing data processing operations, said method comprising the steps of:

storing in a storage device data values and error data associated with said data values;

accessing said storage device by issuing a read access request specifying an address of a data value in said storage device;

reading said data value specified by the read access request;

detecting by means of said associated error data an error in said data value;

performing error correction on said read data value to generate a corrected data value, if said error is detected in said detecting step;

in an error cache having at least one entry, storing an address identifier and an associated replacement data value, and allocating said corrected data value as said replacement data value in said error cache;

performing again said read access request; and in response to the read access request causing the data value identified by the address to be read from the error cache in preference to the storage device in the event of a hit being detected in the error cache.

14. A data processing apparatus comprising:

processing means for performing data processing operations;

storage means for storing data values and error data associated with said data values;

said processing means accessing said storage means by issuing a read access request specifying an address of a data value in said storage means;

access control means, responsive to said read access request, to read said data value specified by the read access request;

error detection means for detecting by means of said associated error data an error in said read data value;

error correction means for performing error correction on said read data value to generate a corrected data value, if said error detection means indicates occurrence of said error;

an error cache means, having at least one entry, for storing an address identifier and an associated replacement data value;

on occurrence of said error, said error cache means comprises means for allocating said corrected data value as the replacement data value in one of said at least one entries of said error cache means, and the read access request being performed again;

the access control means, responsive to the access request, further causing the data value identified by the address to be read from the error cache means in preference to the storage means in the event of a hit being detected in the error cache means.

15. Data processing circuitry for accessing a storage device configured to store data values and error data associated with said data values, the data processing circuitry comprising:

a processing unit for performing data processing operations;

said processing unit accessing said storage device by issuing a read access request specifying an address of a data value in said storage device;

access control circuitry, responsive to said read access request, to read said data value specified by the read access request;

error detection circuitry for detecting by means of said associated error data an error in said read data value;

error correction circuitry for performing error correction on said read data value to generate a corrected data value, if said error detection circuitry indicates occurrence of said error;

an error cache, having at least one entry, configured to store an address identifier and an associated replacement data value;

on occurrence of said error, said error cache configured to allocate said corrected data value as the replacement data value in one of said at least one entries of said error cache, and the read access request being performed again;

the access control circuitry, responsive to the access request, configured to cause the data value identified by the address to be read from the error cache in preference to the storage device in the event of a hit being detected in the error cache.

* * * * *